United States Patent
Sato

(10) Patent No.: US 10,522,668 B2
(45) Date of Patent: Dec. 31, 2019

(54) SEMICONDUCTOR DEVICE WITH CURRENT/VOLTAGE VIBRATION SUPPRESSION AT TURNING ON AND OFF

(71) Applicant: FUJI ELECTRIC CO., LTD., Kawasaki-shi, Kanagawa (JP)

(72) Inventor: Shigeki Sato, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 435 days.

(21) Appl. No.: 15/197,945

(22) Filed: Jun. 30, 2016

(65) Prior Publication Data
US 2016/0308038 A1 Oct. 20, 2016

Related U.S. Application Data

(63) Continuation of application No. PCT/JP2015/066531, filed on Jun. 8, 2015.

(30) Foreign Application Priority Data

Jul. 10, 2014 (JP) .................... 2014-142262

(51) Int. Cl.
*H01L 29/739* (2006.01)
*H01L 29/868* (2006.01)
(Continued)

(52) U.S. Cl.
CPC ...... *H01L 29/7397* (2013.01); *H01L 27/0658* (2013.01); *H01L 29/4236* (2013.01); *H01L 29/4916* (2013.01); *H01L 29/868* (2013.01)

(58) Field of Classification Search
CPC .................................................. H01L 29/7397
See application file for complete search history.

(56) References Cited

U.S. PATENT DOCUMENTS

2006/0071276 A1* 4/2006 Zundel ............... H01L 27/0255
257/355
2007/0275523 A1* 11/2007 Su ....................... H01L 27/1087
438/238
(Continued)

FOREIGN PATENT DOCUMENTS

| JP | H03-93457 A | 4/1991 |
| JP | H05-3251 A | 1/1993 |

(Continued)

OTHER PUBLICATIONS

M. Sumitomo et al., "Injection Control Technique for High Speed Switching with a double gate PNM-IGBT", 2013 25th International Symposium on Power Semiconductor Devices & IC's (ISPSD), pp. 33-36, May 26-30, 2013.

*Primary Examiner* — Robert K Carpenter
(74) *Attorney, Agent, or Firm* — Rabin & Berdo, P.C.

(57) ABSTRACT

A semiconductor device, including a semiconductor substrate, an active region formed on the semiconductor substrate, and a gate runner disposed to surround the active region. The active region includes a first cell group in which a gate electrode of each cell is directly connected to the gate runner, and a second cell group in which a gate electrode of each cell is connected to the gate runner via a di/dt mitigating element. The di/dt mitigating element is a capacitor, a resistor connected in parallel to a capacitor, or an inverse-parallel-connected diode.

14 Claims, 13 Drawing Sheets

(51) Int. Cl.
*H01L 29/49* (2006.01)
*H01L 27/06* (2006.01)
*H01L 29/423* (2006.01)

(56) References Cited

U.S. PATENT DOCUMENTS

| | | |
|---|---|---|
| 2008/0303560 A1 | 12/2008 | Higashi et al. |
| 2011/0121661 A1* | 5/2011 | Kawakami ................ G05F 1/67 307/110 |
| 2013/0026537 A1 | 1/2013 | Rahimo et al. |
| 2013/0037853 A1* | 2/2013 | Onozawa ............ H01L 29/0661 257/139 |

FOREIGN PATENT DOCUMENTS

| | | | | |
|---|---|---|---|---|
| JP | H08-32064 A | 2/1996 | | |
| JP | 2000-101076 A | 4/2000 | | |
| JP | 2000101076 A | * 4/2000 | ......... | H01L 29/7397 |
| JP | 2003-125574 A | 4/2003 | | |
| JP | 2007-201024 A | 8/2007 | | |
| JP | 2008-306618 A | 12/2008 | | |
| JP | 2011-134984 A | 7/2011 | | |
| JP | 2012-231194 A | 11/2012 | | |
| JP | 2013-522924 A | 6/2013 | | |

* cited by examiner

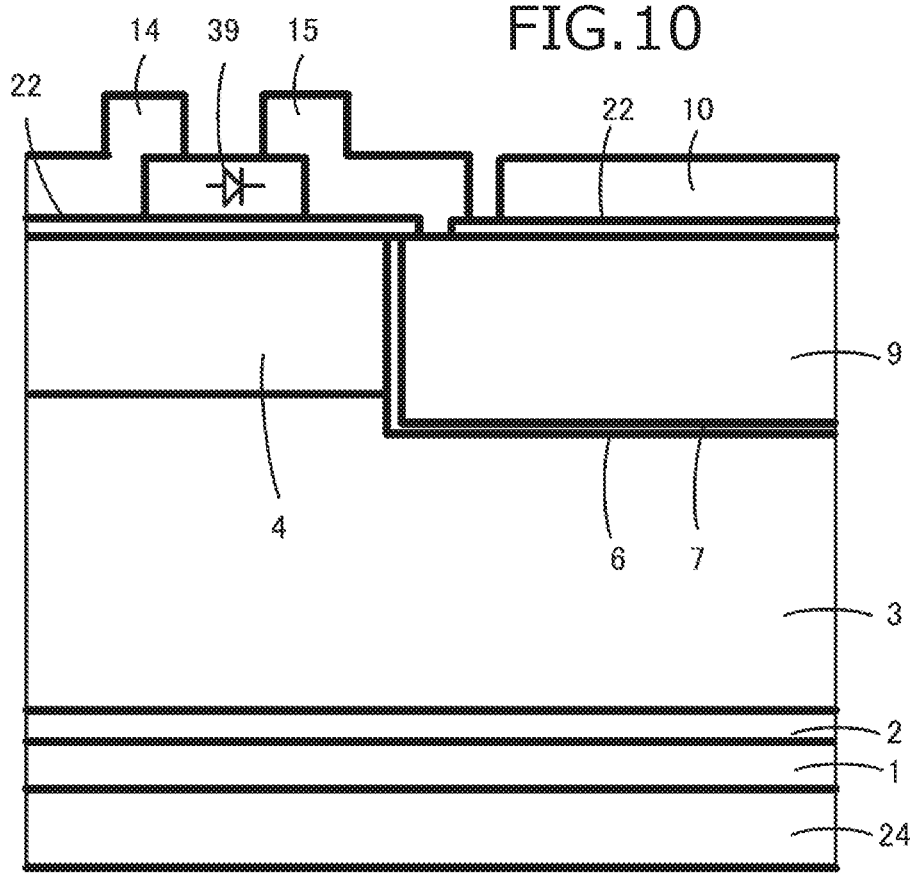

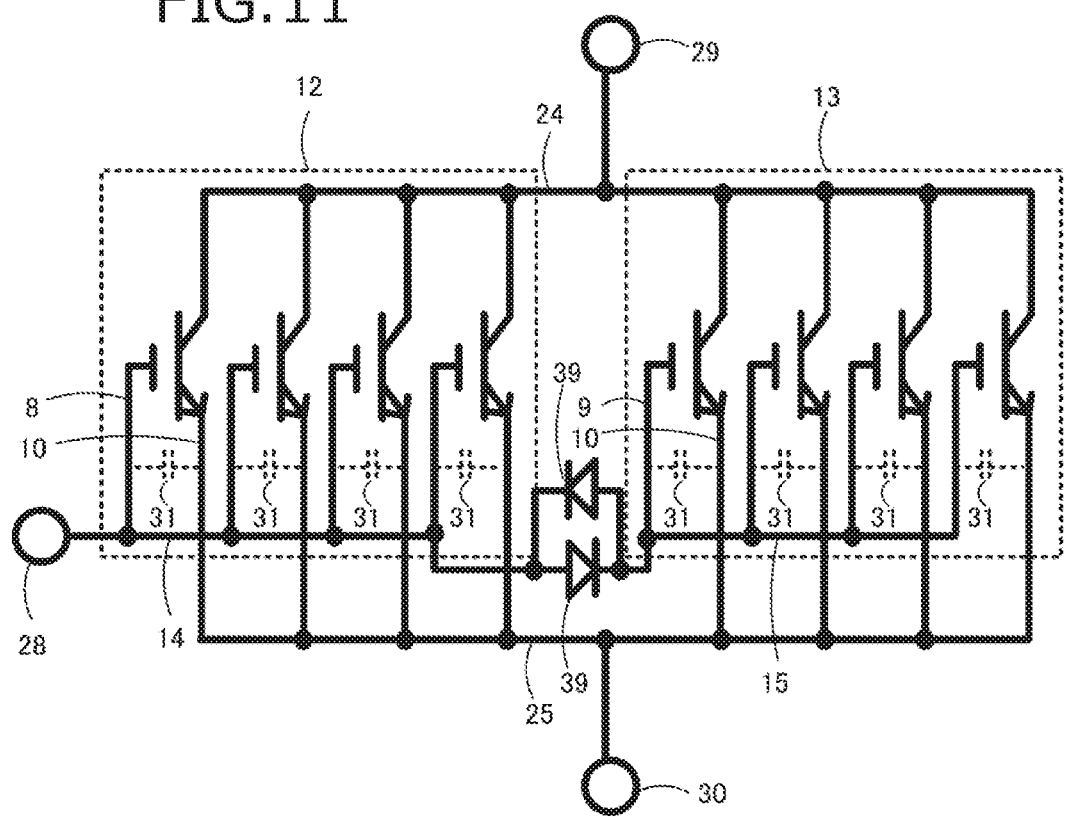

US 10,522,668 B2

SEMICONDUCTOR DEVICE WITH CURRENT/VOLTAGE VIBRATION SUPPRESSION AT TURNING ON AND OFF

CROSS REFERENCE TO RELATED APPLICATIONS

This is a continuation application of International Application PCT/JP2015/066531, filed on Jun. 8, 2015, which claims priority from a Japanese Patent Application No. 2014-142262, filed on Jul. 10, 2014, the contents of which are incorporated herein by reference.

BACKGROUND OF THE INVENTION

1. Field of the Invention

Embodiments of the present invention relate to a semiconductor device.

2. Description of the Related Art

Semiconductor devices such as power diodes and insulated gate bipolar transistors (IGBTs) are provided in power converting equipment such as converters and inverters and are indispensable for controlling rotary motors and servomotors.

FIG. 12 is a plan diagram depicting an overall view of a semiconductor device 600 having a conventional trench structure. FIG. 13 is a cross-sectional view of the semiconductor device 600 along cutting line XIII-XIII in FIG. 12. An IGBT is taken as an example for the semiconductor device 600.

In FIGS. 12 and 13, an n buffer layer 62 is disposed on a p collector layer 61 disposed in a semiconductor substrate 83, and an n drift layer 63 is disposed on the n buffer layer 62. A p well layer 64 is disposed in the surface layer of the n drift layer 63. A trench 65 is disposed that penetrates the p well layer 64 and that reaches the n drift layer 63. The trench 65 is filled with a polysilicon to dispose a gate electrode 68 via a gate insulating film 67 on an inner wall. An n emitter layer 70 is selectively disposed in a surface layer of the p well layer 64 between the trenches 65.

An IGBT cell 72a includes the p collector layer 61, the n buffer layer 62, the n drift layer 63, the p well layer 64, the n emitter layer 70, and the gate electrode 68 disposed in the trench 65. The p collector layer 61 is connected to a collector electrode 84 and the n emitter layer 70 is connected to an emitter electrode 85. The emitter electrode 85 and the gate electrode 68 are electrically isolated from each other by an interlayer insulating film 82. An IGBT cell group 72 to be an aggregate of the IGBT cells 72a is divided by a gate runner 74 into four and is disposed in an active region 86. The gate runner 74 is connected to a gate terminal 88.

FIG. 14 is an equivalent internal circuit diagram of the semiconductor device 600 depicted in FIG. 12. The plural IGBT cells 72a are connected to each other in parallel, and the gate runner 74 is connected to the gate terminal 88. The collector electrode 84 of the IGBT cell group 72 is connected to a collector terminal 89 and the emitter electrode 85 of the IGBT cell group 72 is connected to an emitter terminal 90.

When an ON signal is input to the gate terminal 88, each of the IGBT cells 72a is simultaneously turned on. Reduced cell intervals consequent to advancements in fine fabrication and high performance IGBTs (the semiconductor device 600), which include many cells, have increased electron injection efficiency to enable greater collector current to flow with the same chip size (the size of the semiconductor substrate 83). Therefore, the di/dt, which is the instantaneous rate of change in current over time, becomes large with turning on and turning off events.

When the di/dt becomes great, vibration is caused in the current and the voltage at turning on and turning off events. The vibration of the current and the voltage generate radiation noise resulting in the inconvenience of malfunctions of an adjacent gate driving circuit and an adjacent electronic device in addition to malfunctions of the IGBT itself.

An IGBT has been proposed that includes plural independent gate terminals and gate driving circuit that includes a shift resistor, where gate output signals are sequentially delayed and input to the gate terminals to prevent vibrations (for example, refer to Japanese Laid-Open Patent Publication No. H8-32064). As a result, the cells of the IGBT cell group are sequentially delayed to be turned on or turned off whereby the di/dt becomes gradual.

With the method described in Japanese Laid-Open Patent Publication No. H8-32064, a shift resistor circuit is necessary and a problem arises in that the driving circuit becomes complicated.

SUMMARY OF THE INVENTION

According to one aspect of the present invention, a semiconductor device includes a semiconductor substrate an active region comprising a MOS (metal oxide semiconductor) switching element disposed on the semiconductor substrate;

an edge termination structure region disposed so as to surround the active region; and a gate runner disposed between one of the active region and the edge termination structure region, and the active regions. The active region includes a first cell group in which a gate electrode of the MOS switching element is directly connected to the gate runner, and a second cell group that is connected to the gate runner via a di/dt mitigating element. The di/dt mitigating element is one of a capacitor and a resistor that is connected in parallel to the capacitor. The capacitor includes a trench disposed in the semiconductor substrate, an insulating film covering an inner wall of the trench, multiple electrodes each formed using a polysilicon and disposed on both sides in the trench via the insulating film, and a dielectric material disposed between electrodes among the multiple electrodes.

According to another aspect, a semiconductor device includes a semiconductor substrate; an active region comprising a MOS switching element disposed on the semiconductor substrate; an edge termination structure region disposed so as to surround the active region; and a gate runner disposed between one of the active region and the edge termination structure region, and the active regions. The active region includes a first cell group in which a gate electrode of the MOS switching element is directly connected to the gate runner, and a second cell group that is connected to the gate runner via a di/dt mitigating element. The di/dt mitigating element is one of a capacitor and a resistor that is connected in parallel to the capacitor. The capacitor includes a first gate wire of the first cell group and a second gate wire of the second cell group as electrodes, and a dielectric material disposed between the first and second gate wires.

According to another aspect, a semiconductor device includes a semiconductor substrate; an active region comprising a MOS switching element disposed in the semiconductor substrate; an edge termination structure region disposed so as to surround the active region; and a gate runner disposed between one of the active region and the edge termination structure region, and the active regions. The active region includes a first cell group in which a gate electrode of the MOS switching element is directly connected to the gate runner, and a second cell group that is connected to the gate runner via a di/dt mitigating element. The di/dt mitigating element is an inverse-parallel-connected diode.

In the semiconductor device, the diode is formed using a polysilicon.

In the semiconductor device, the MOS switching element is an insulated gate bipolar transistor.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 10 is a cross-sectional view of the semiconductor device 500 along cutting line X-X in FIG. 9B;

FIG. 11 is an equivalent circuit diagram of the semiconductor device 500;

DETAILED DESCRIPTION OF THE INVENTION

Figure 1A:
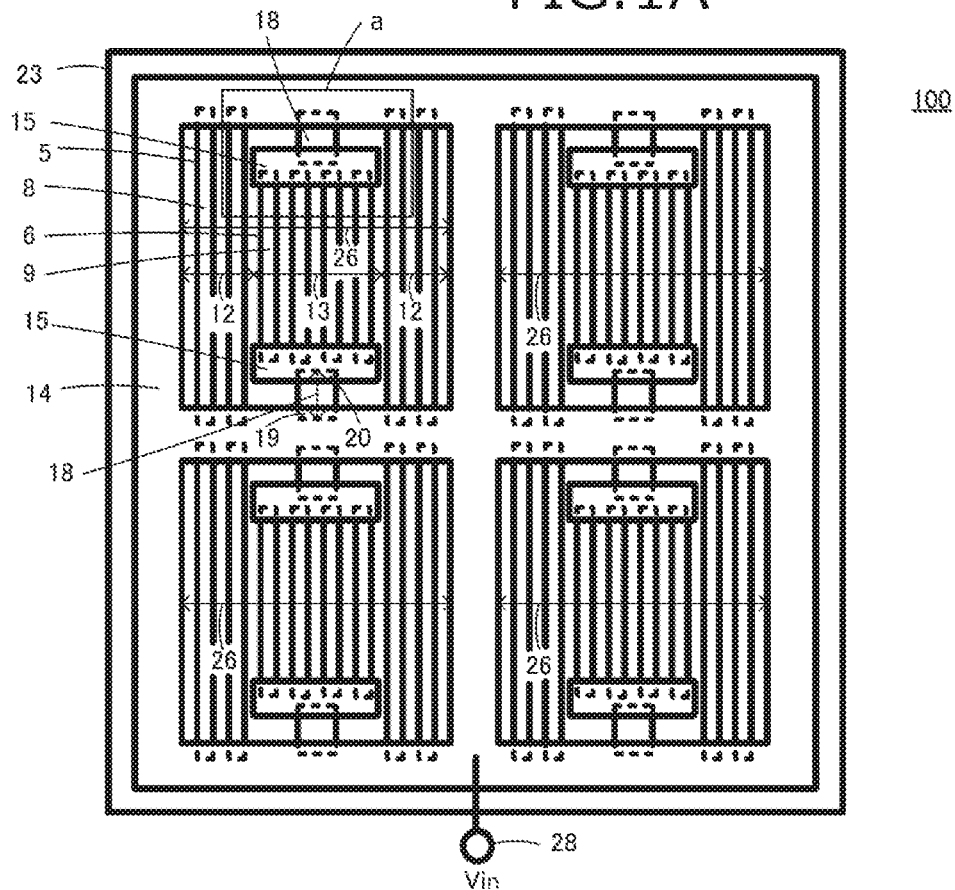
FIG. 1A is a plan diagram depicting an overall view of a semiconductor device 100 of a first embodiment according to the present invention.

Embodiments of a semiconductor device according to the present invention will be described in detail with reference to the accompanying drawings. In the present description and accompanying drawings, layers and regions prefixed with n or p mean that majority carriers are electrons or holes. In the description of the embodiments below and the accompanying drawings, identical constituent elements will be given the same reference numerals and will not be repeatedly described. The accompanying drawings described in the embodiments are not depicted in proper scales or correct dimension ratios to facilitate understanding. The present invention is not limited by the description of the embodiments given below without departing from the gist thereof.

Figure 1B:
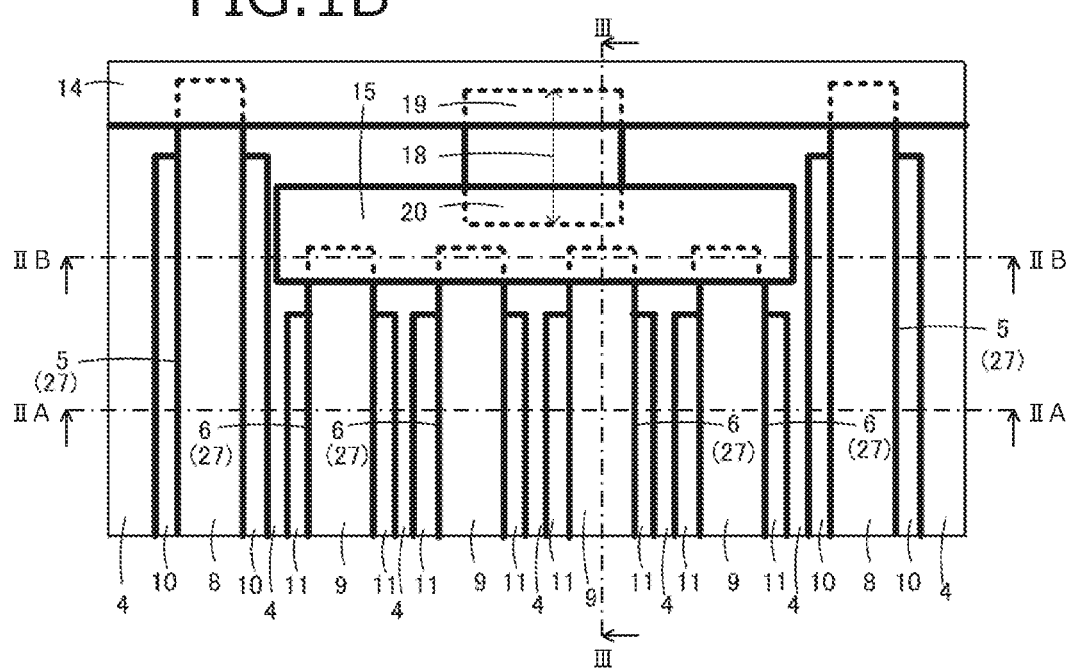
FIG. 1B is an enlarged diagram of a portion "a" in FIG. 1A.
Figure 2A:
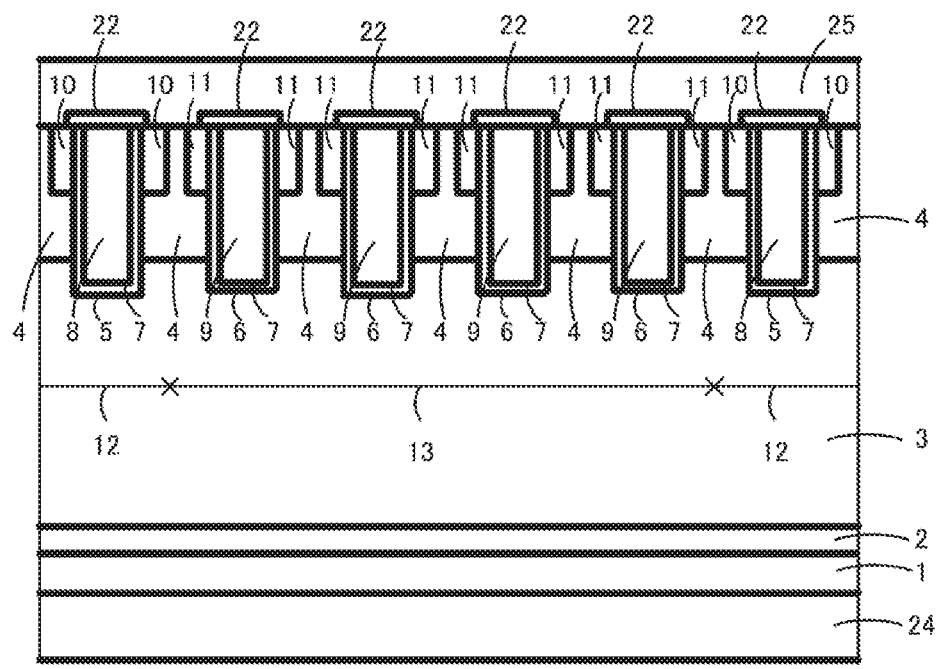
FIG. 2A is a cross-sectional view of the semiconductor 100 device along cutting IIA-IIA in FIG. 1B.
Figure 2B:
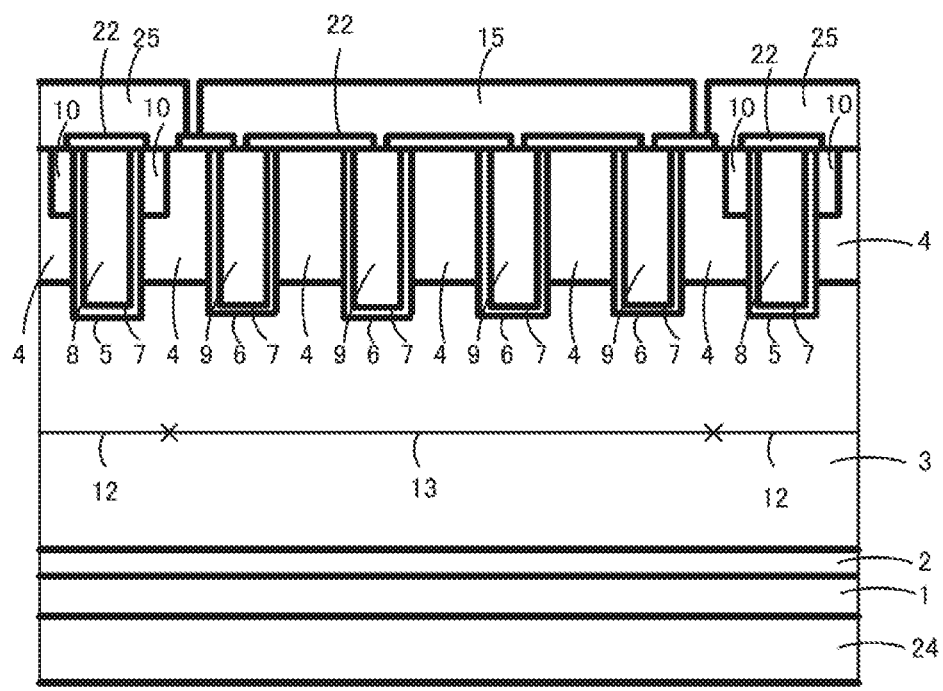
FIG. 2B is a cross-sectional view of the semiconductor device 100 along cutting IIB-IIB line in FIG. 1B.
Figure 3:
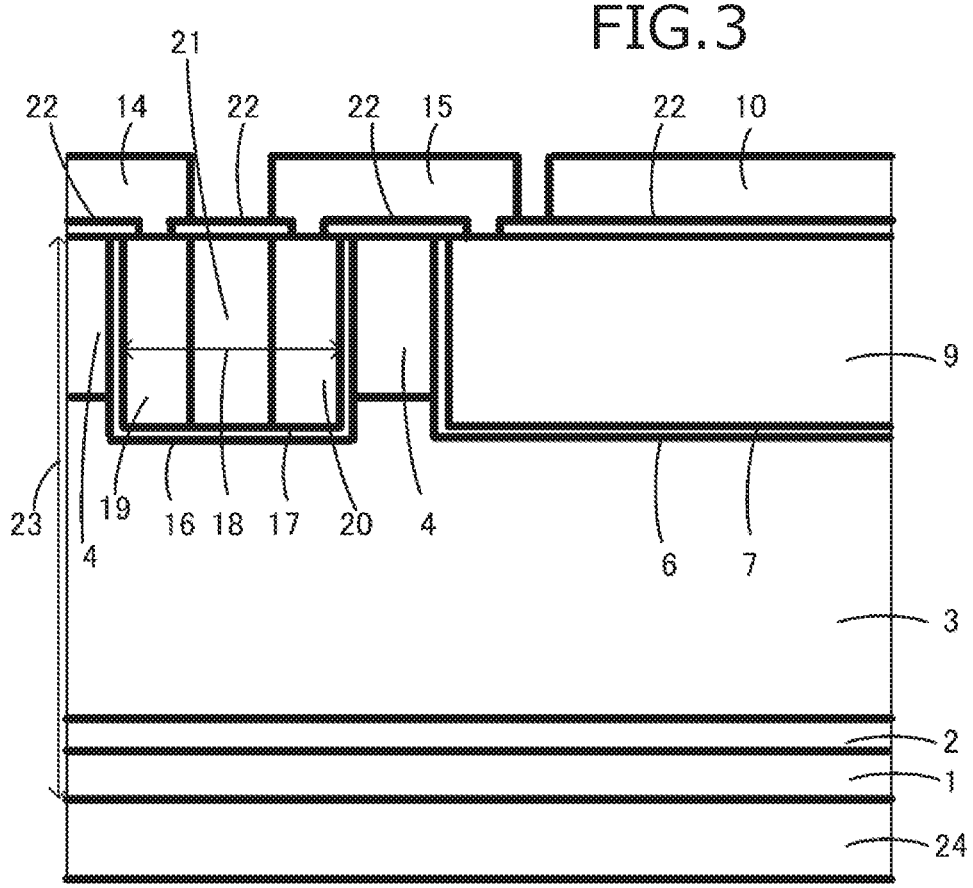
FIG. 3 is a cross-sectional view of the semiconductor device 100 along cutting III-III line in FIG. 1B.

FIGS. 1A, 1B, 2A, 2B, and 3 are diagrams of a semiconductor device of a first embodiment according to the present invention. FIG. 1A is a plan diagram depicting the semiconductor device overall. FIG. 1B is an enlarged diagram of a portion "a" in FIG. 1A. FIG. 2A is a cross-sectional view of the semiconductor device along cutting IIA-IIA in FIG. 1B. FIG. 2B is a cross-sectional view of the semiconductor device along cutting IIB-IIB line in FIG. 1B. FIG. 3 is a cross-sectional view of the semiconductor device along cutting III-III line in FIG. 1B.

In FIGS. 1A and 1B, an edge termination structure region (not depicted) is disposed on an outer periphery of a semiconductor substrate 23, and a first gate runner 14 is disposed inside the edge termination structure region. An active region 26 is disposed being divided by the first gate runner 14 into, for example, four. A first IGBT cell group 12 including four long-stripe first trenches 5 and a second IGBT cell group 13 including four short-stripe second trenches 6 are disposed in each of the divided active regions 26. Although the number of the first and the second trenches 5 and 6 is assumed to be four in the first embodiment, the number is not limited hereto.

As depicted in FIG. 1B, a first gate electrode 8 of the first IGBT cell group 12 is connected to the first gate runner 14 and a second gate electrode 9 of the second IGBT cell group 13 is connected to a second gate runner 15. The first gate runner 14 and the second gate runner 15 are respectively connected to a first electrode 19 and a second electrode 20, which are polysilicon electrodes of a capacitor 18 that is a di/dt mitigating element. The first gate runner 14 and the second gate runner 15 are gate wires and are formed using a metal such as, for example, aluminum.

The first trenches 5 and the second trenches 6 are aggregated to form a trench group 27. The trench group 27 is disposed at each of four locations and the first gate runner 14 surrounds each trench group 27. The first gate runner 14 is connected to the first gate electrodes 8 of the first IGBT cell group 12 and is also connected to one gate terminal 28. The second gate runner 15 is connected to the second gate electrodes 9 of the second IGBT cell group 13.

As described later, a first single IGBT cell includes the gate electrode 8 disposed in one of the trenches 5, n emitter layers 10 disposed on both sides of the trench 5, and an n drift layer 3, an n buffer layer 2, and a p collector layer 1 that are disposed immediately beneath the above components. These first single IGBT cells are aggregated to form the first IGBT cell group 12. Similarly, a second single IGBT cell includes the gate electrode 9 disposed in one of the trenches 6, n emitter layers 11 disposed on both sides of this trench, and the n drift layer 3, the n buffer layer 2, and the p collector layer 1 that are disposed immediately beneath the above components. These second single IGBT cells are aggregated to form the second IGBT cell group 13.

The capacitor 18 is connected between the first gate runner 14 and the second gate runner 15, and a gate input voltage Vin input to the gate terminal 28 is thereby delivered as a lowered gate voltage to the second gate electrode 9 of the second IGBT cell group 13. The di/dt of the second IGBT cell group 13 is thereby reduced and, as a result, the di/dt of the IGBT (a semiconductor device 100) becomes gradual at turning on and turning off events. With a gradual di/dt, vibration generated in the collector-emitter voltage and the collector current of the IGBT is prevented.

In FIG. 2A, the n buffer layer 2 is disposed on the p collector layer 1 and the n drift layer 3 is disposed on the n buffer layer 2. A p well layer 4 is disposed in the surface layer of the n drift layer 3. The long first trench 5 and the short second trench 6 are disposed penetrating the p well layer 4 and reach the n drift layer 3. The first trench 5 and the second trench 6 are filled with a polysilicon, whereby the first gate electrode 8 and the second gate electrode 9 are disposed therein via a gate insulating film 7 on an inner wall. In the surface layer of the p well layer 4 between the first trenches 5 or the second trenches 6, a first n emitter layer 10 or a second n emitter layer 11 is disposed.

The first IGBT cell group 12 includes the p collector layer 1, the n buffer layer 2, the n drift layer 3, the p well layer 4, the first n emitter layers 10, and the first gate electrodes 8 disposed in the first trenches 5. The second IGBT cell group 13 includes the p collector layer 1, the n buffer layer 2, the n drift layer 3, the p well layer 4, the second n emitter layers 11, and the second gate electrodes 9 disposed in the second trenches 6. The first IGBT cell group 12 and the second IGBT cell group 13 are disposed in the active region 26 surrounded by the first gate runner 14.

The p collector layer 1 is connected to a collector electrode 24, and the first emitter layers 10 and the second emitter layers 11 are connected to an emitter electrode 25. The emitter electrode 25, and the first gate electrodes 8 and the second gate electrodes 9 are electrically insulated from each other by an interlayer insulating film 22.

In FIG. 2B, the first emitter layers 10 are disposed on both sides of the first trench 5 and the second n emitter layer 11 is not disposed on both sides of the second trench 6. The second gate runner 15 connected to the second gate electrode 9 is disposed inside the first gate runner 14 connected to the first gate electrode 8. The first gate runner 14 and the second gate runner 15 are electrically insulated from the p well layer 4 by the interlayer insulating film 22.

The first gate runner 14 and the first gate electrode 8, and the second gate runner 15 and the second gate electrode 9 are electrically connected to each other through contact holes disposed in the interlayer insulating film 22.

In FIG. 3, a third trench 16 is disposed that penetrates the p well layer 4 disposed beneath a space that is between the first gate runner 14 and the second gate runner 15 and includes a vicinity of an end of the second gate runner 15 a vicinity of an end of the first gate runner 14, the third trench 16 reaching the n drift layer 3. Further, in FIG. 3, an insulating film 17 is disposed on an inner wall of the third trench 16. Although the depth of the third trench 16 is set to be equal to the depths of the first trench 5 and the second trench 6 herein, the third trench 16 may be formed to be shallow in the p well layer 4.

The capacitor 18 is disposed in the third trench 16 via the insulating film 17. The capacitor 18 includes the first electrode 19, the second electrode 20, and a dielectric material 21 between the first and second electrodes 19, 20. Examples of the dielectric material 21 include, for example, a resin, an insulating material, and the like. In FIG. 1A, two capacitors 18 are disposed in one second IGBT cell group 13. When the second gate runner is not separated for two locations and is continuously disposed as one, a single capacitor 18 may be disposed.

The first electrode 19 is electrically connected to an end of the first gate runner 14 and the second electrode 20 is electrically connected to an end of the second gate runner 15. The first electrode 19 and the second electrode are formed using, for example, a polysilicon similar to that of the first gate electrode 8 and the second gate electrode 9. The insulating film 17 is formed using, for example, an oxide film similar to that of the gate insulating film 7. This configuration enables formation of the capacitor 18 in the semiconductor substrate 23.

Figure 4:
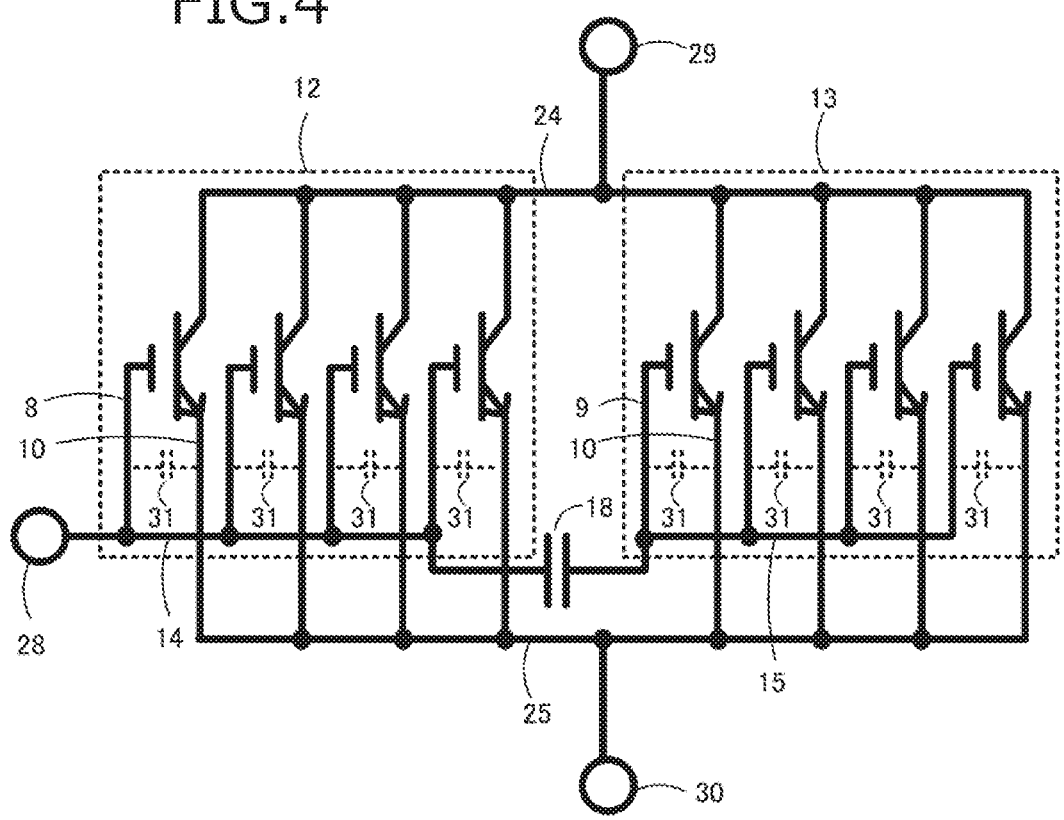
FIG. 4 is an equivalent circuit diagram of the semiconductor device 100.

FIG. 4 is an equivalent circuit diagram of the semiconductor device 100 depicted in FIGS. 1A to 3. In FIG. 4, the number of capacitors 18 is assumed to be one. Parasitic gate-emitter capacitance 31 formed between the first gate electrode 8 and the first n emitter layer 10 of an IGBT cell in the first IGBT cell group 12 and parasitic gate-emitter capacitance 31 formed between the first gate electrode 9 and the first n emitter layer 10 of an IGBT cell in the second IGBT cell group 13 are equal to each other, and are indicated by dotted lines.

The gate terminal 28 is connected to the first gate runner 14 and the first gate runner 14 is connected to the first gate electrodes 8 of the first IGBT cell group 12. The second gate runner 15 is connected to the second gate electrodes 9 of the second IGBT cell group 13. The capacitor 18 is disposed between and is connected to the first gate runner 14 and the second gate runner 15. The collector electrode 24 is electrically connected to a collector terminal 29. The emitter electrode 25 is connected to an emitter terminal 30.

Figure 5A:
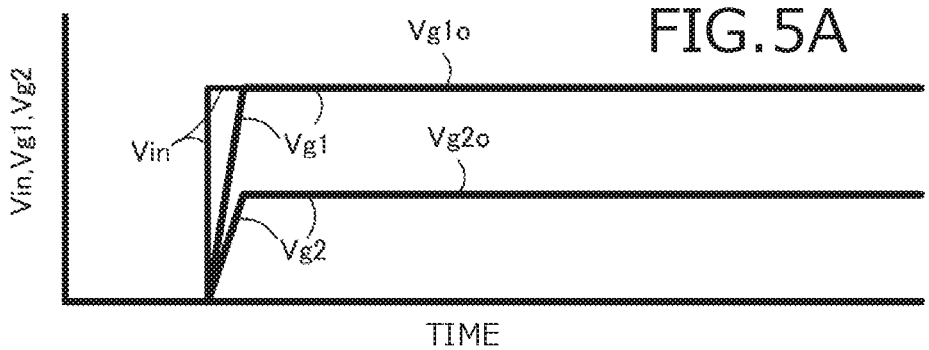
FIG. 5A is a diagram of a gate voltage waveform.
Figure 5B:
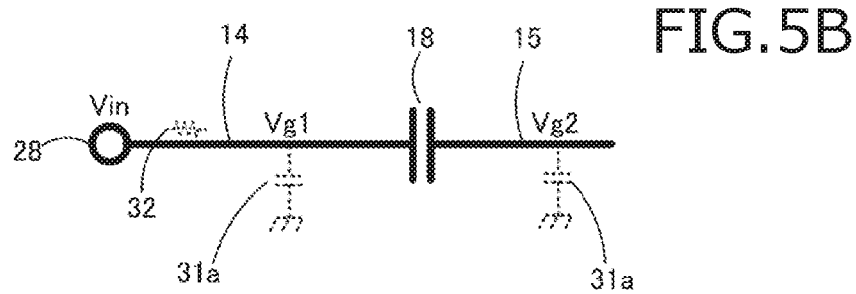
FIG. 5B is a connection diagram of a gate terminal 28, a capacitor 18, and a parasitic gate-emitter capacitance 31.
Figure 5C:
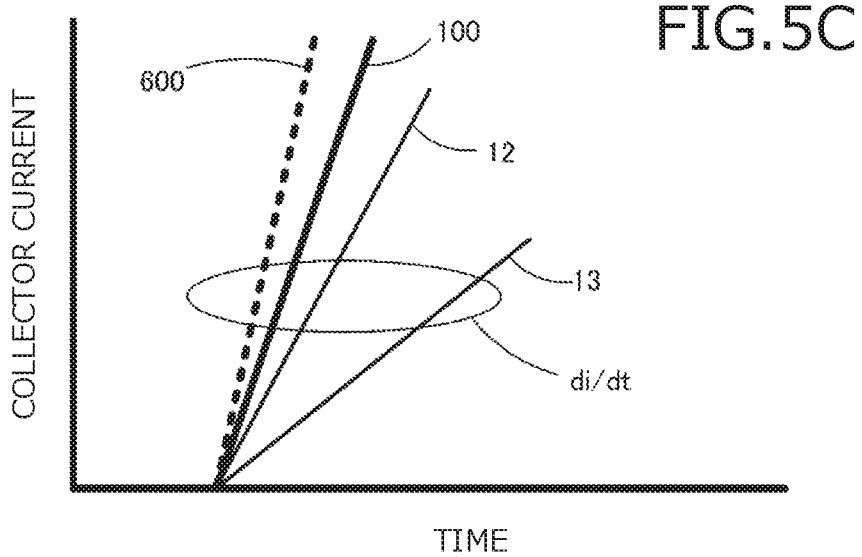
FIG. 5C is an explanatory diagram of di/dt at turning on for a first IGBT cell group 12, a second IGBT cell group 13, and an IGBT (semiconductor device 100)

FIGS. 5A, 5B, and 5C are explanatory diagrams of an operation of the semiconductor device 100. FIG. 5A is a diagram of a gate voltage waveform. FIG. 5B is a connection diagram of the gate terminal 28, the capacitor 18, and the parasitic gate-emitter capacitance 31. FIG. 5C is an explanatory diagram of the di/dt at turning on for the first IGBT cell group 12, the second IGBT cell group 13, and the IGBT (the semiconductor device 100).

The gate input voltage Vin from the gate terminal 28 is input to the first gate electrode 8 of the first IGBT cell group 12 as a first gate voltage Vg1 via the first gate runner 14. The gate input voltage Vin is divided into voltages for the capacitor 18 and the parasitic gate-emitter capacitance 31 of the second IGBT cell group 13 (depicted as a total parasitic gate-emitter capacitance 31$a$ in FIG. 5B) and is input to the second gate electrode 9 as a second gate voltage Vg2 through the second gate runner 15. The rise of the gate input voltage Vin is quick while the rise of the first gate voltage Vg1 and the rise of the second gate voltage Vg2 are gradual due to wire resistance 32.

The second gate voltage Vg2, which is low, is input to the second gate electrodes 9 of the second IGBT cell group 13 and the di/dt at the turning on and the turning off of the second IGBT cell group 13 thereby becomes gradual as compared to the di/dt of the first IGBT cell group 12. As a result, the di/dt is made to be gradual at the tuning on of the IGBT (the semiconductor device 100) that includes both the first IGBT cell group 12 and the second IGBT cell group 13.

A reached gate voltage Vg2$c$ of the second gate voltage Vg2, however, becomes lower than a reached gate voltage Vg1$o$ of the first gate voltage Vg1, and the driving of the second IGBT cell group 13 may be difficult. To prevent this, the reached voltage Vg2$o$ of the second gate voltage Vg2 of the second IGBT cell group 13 may set to be higher than a half the reached voltage Vg1$o$ of the first gate voltage Vg1 that is input to the first IGBT cell group 12 by increasing the capacitance of the capacitor 18 to be greater than the parasitic gate-emitter capacitance 31 of the second IGBT cell group 13.

The reached voltage Vg2o of the second gate voltage Vg2 input to the second IGBT cell group 13 becomes higher as the capacitance of the capacitor 18 is increased. The di/dt, however, becomes steep at the turning on and the turning off, and therefore, the reached voltage Vg2o of the second gate voltage Vg2 may be set to be equal to or less than 90% of the reached voltage Vg1o of the first gate voltage Vg1. Assuming that the total parasitic gate-emitter capacitance 31a of the second IGBT cell group 13 is on the order of nF, the capacitance of the capacitor 18 may be set to be about several 10 nF to several 100 nF.

To cause the di/dt to be gradual by sequentially delaying the turning on and the turning off of the IGBT cells, a method is present according to which a gate resistor Rg is inserted in series into gate polysilicon wiring of the IGBT cell group to be combined with each parasitic gate-emitter capacitance Cg present between the gate and the emitter of the IGBT cell group, whereby each gate resistance Rg is adjusted and the CR time constant is sequentially increased. With this method, however, the gate resistor has to be disposed in each IGBT cell group and problems arise in that the structure is therefore complicated and loss occurs at the gate resistor, whereby the gate driving power increases.

As described, according to the first embodiment, the di/dt of the IGBT (the semiconductor device 100) can be set to be gradual by a configuration that is simpler than a method of sequentially increasing the CR time constant or a method of using a shift resistor. Because no electric power is consumed by the capacitor 18, the gate driving power can be reduced relative to that of a method of sequentially increasing the CR time constant.

Although the IGBT has been taken as an example of the semiconductor device 100, the semiconductor device 100 may be a metal oxide semiconductor field effect transistor (MOSFET) or the like. For example, in addition to silicon, a wide gap material such as, for example, silicon carbide (SiC) or gallium nitride (GaN) may be used as a material of the semiconductor device 100.

Although description has been given with reference to two-stage IGBT cell groups (the first IGBT cell group 12 and the second IGBT cell group 13) in the first embodiment, the number of stages may be increased.

Although description has been given with reference to a trench-gate-type IGBT cell in the first embodiment, a planar gate type may be used.

Figure 6:
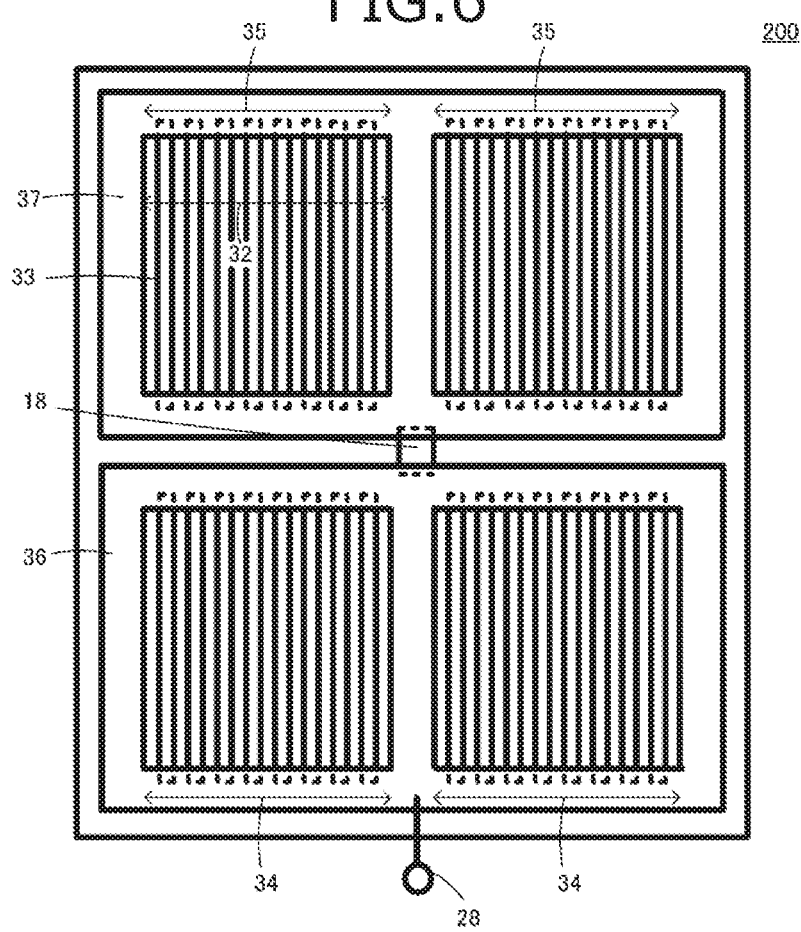
FIG. 6 is a plan diagram depicting an overall view of a semiconductor device 200 of a second embodiment according to the present invention.

FIG. 6 is a plan diagram depicting an overall view of a semiconductor device 200 of a second embodiment according to the present invention. The semiconductor device 200 differs from the semiconductor device 100 in FIG. 1A to FIG. 3 in that the semiconductor device 200 has trenches 33 that are formed in stripes of equal length in an active region 32, and the semiconductor device 200 is configured to have two first IGBT cell groups 34 surrounded by a first gate runner 36 and two second IGBT cell groups 35 surrounded by a second gate runner 37.

The capacitor 18, which is the di/dt mitigating element depicted in FIGS. 1A and 1B, is disposed between and connected to the first gate runner 36 and the second gate runner 37. Excluding the above aspects, the configuration is identical to that of the first embodiment.

According to the second embodiment, similarly to the semiconductor device 100 described in the first embodiment, the di/dt of the IGBT (the semiconductor device 200) can be made to be gradual by a simpler configuration.

Figure 7:
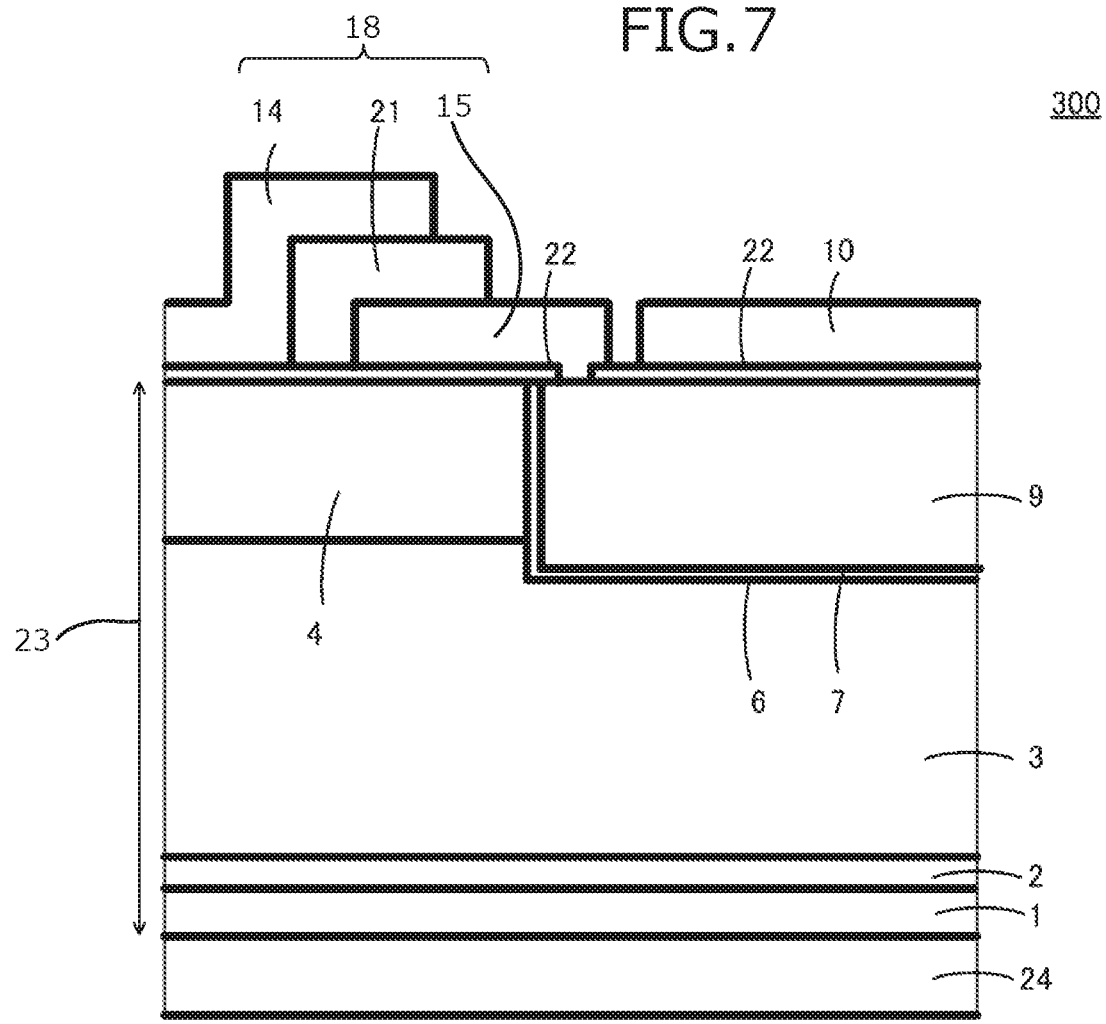
FIG. 7 is a cross-sectional view of a semiconductor device 300 of a third embodiment according to the present invention.

FIG. 7 is a cross-sectional view of a semiconductor device 300 of a third embodiment according to the present invention. The cross-sectional view corresponds to FIG. 3 in the first embodiment. The semiconductor device 300 differs from the semiconductor device 100 of the first embodiment in that the capacitor 18 is disposed on the semiconductor substrate 23 via the interlayer insulating film 22. As depicted in FIG. 7, the capacitor 18 is formed by sandwiching the dielectric material 21 between the first gate runner 14 and the second gate runner 15. Excluding the above aspects, the configuration is identical to that of the first embodiment or the second embodiment.

As described, according to the third embodiment, similarly to the semiconductor device 100 described in the first embodiment, the di/dt of the IGBT (the semiconductor device 300) can be made to be gradual by a simpler configuration.

The capacitor may be formed using the configuration depicted in FIG. 7 in the configuration depicted in FIG. 6. The configuration of the capacitor 18 of the third embodiment may be applied to the semiconductor device 200 in the second embodiment.

Figure 8:
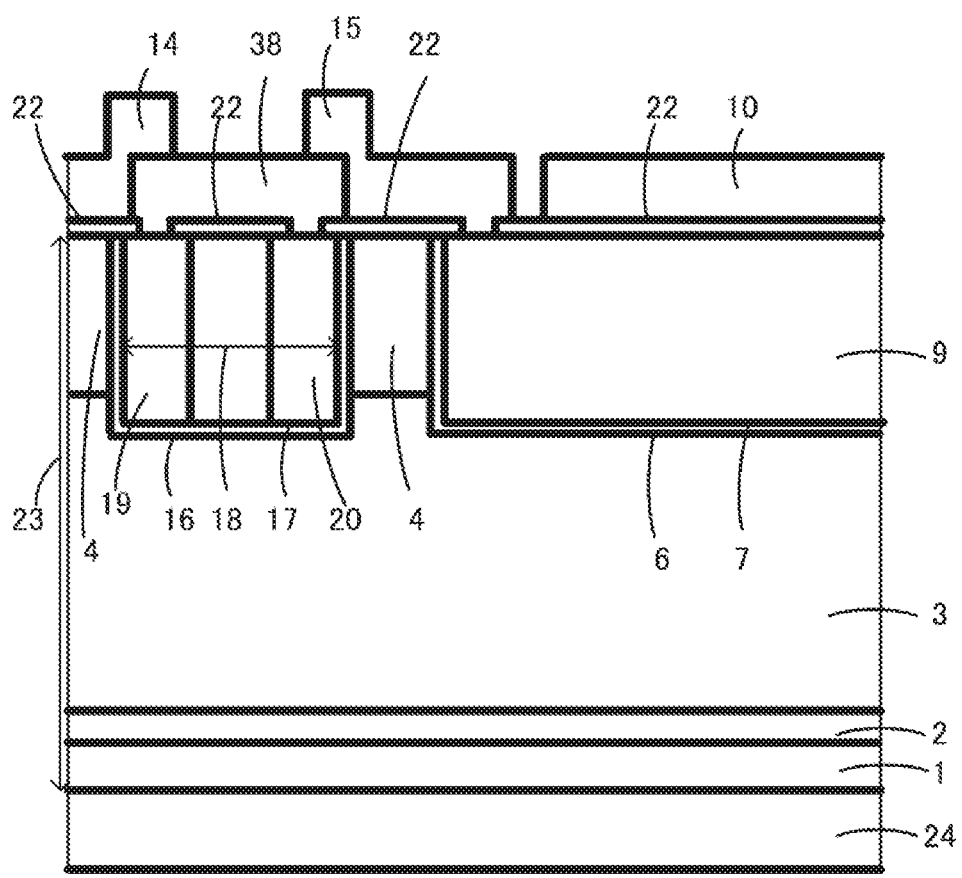
FIG. 8 is a cross-sectional view of a semiconductor device 400 of a fourth embodiment according to the present invention.

FIG. 8 is a cross-sectional view of a semiconductor device 400 of a fourth embodiment according to the present invention. The cross-sectional view corresponds to FIG. 3 in the first embodiment. The semiconductor device 400 differs from the semiconductor device 100 of the first embodiment in that the di/dt mitigating element is configured by disposing a resistor 38 on the capacitor 18 and, connecting resistor 38 and the capacitor 18 to each other in parallel.

With the method of inserting only the capacitor 18, the reached voltage Vg2o of the second gate voltage Vg2 is lower than the reached voltage Vg1o of the first gate voltage Vg1. The reached voltage Vg2o of the second gate voltage Vg2 can then be set to be equal to the reached voltage Vg1o of the first gate voltage Vg1 by connecting the resistor 38. Excluding the above aspects, the configuration is identical to that of the first embodiment.

Thus, operation of all the IGBT cell groups is further stabilized, enabling more stable operation of the IGBT (the semiconductor device 400) to be ensured. The time at which the reached voltage Vg2o of the second gate voltage Vg2 is reached can be delayed and the di/dt can be made to be gradual by setting the value of the resistance of the resistor 38 to be, for example, several kΩ to about several 100Ω.

A time constant τ=Ro×Co configured by a resistance value Ro of the resistor 38 and the total value Co of the parasitic gate-emitter capacitance 31 of the second IGBT cell group 13 may be set as the resistance value Ro of the resistor 38 when the time domain is the di/dt of the rise or the fall of the collector current of the IGBT.

As described, according to the fourth embodiment, similarly to the semiconductor device 100 described in the first embodiment, the di/dt of the IGBT (the semiconductor device 400) can be made to be gradual by a simpler configuration.

The capacitor may be formed using the configuration of FIG. 8 in the configuration of FIG. 6. The configuration of the capacitor 18 and the resistor 38 of the fourth embodiment may be applied to the semiconductor device 200 in the second embodiment.

Figure 9A:
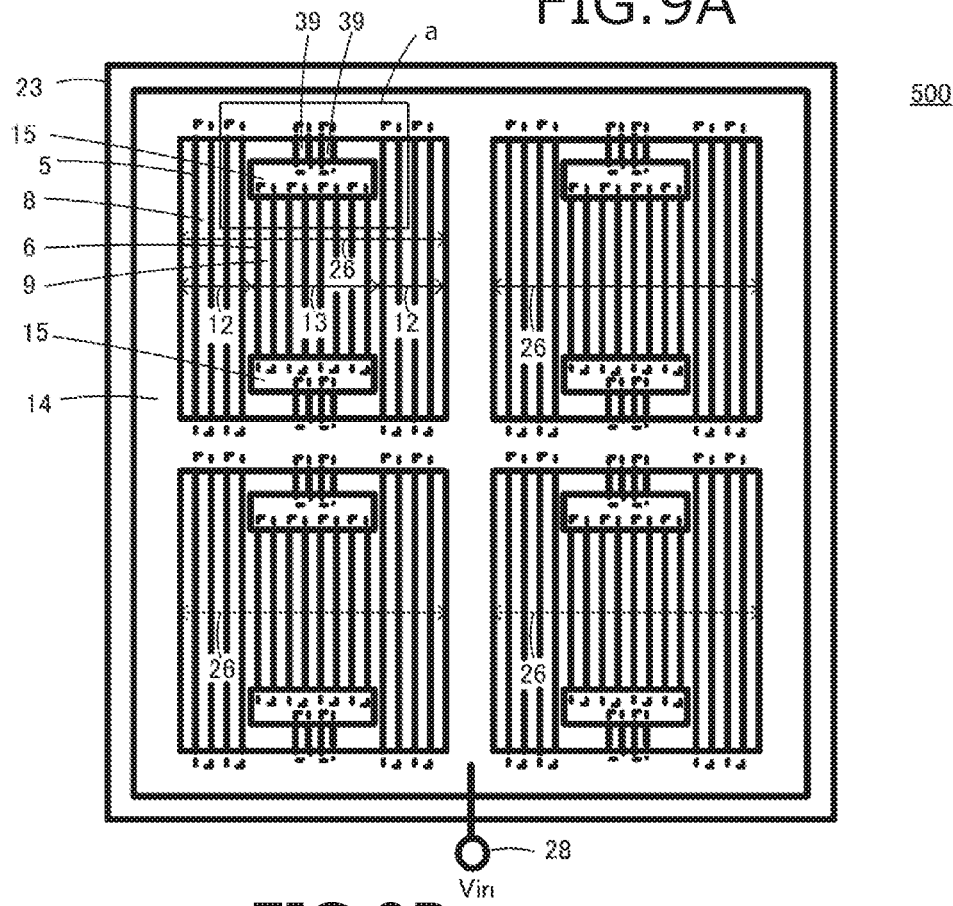
FIG. 9A is a plan diagram depicting an overall view of a semiconductor device 500 of a fifth embodiment according to the present invention.
Figure 9B:
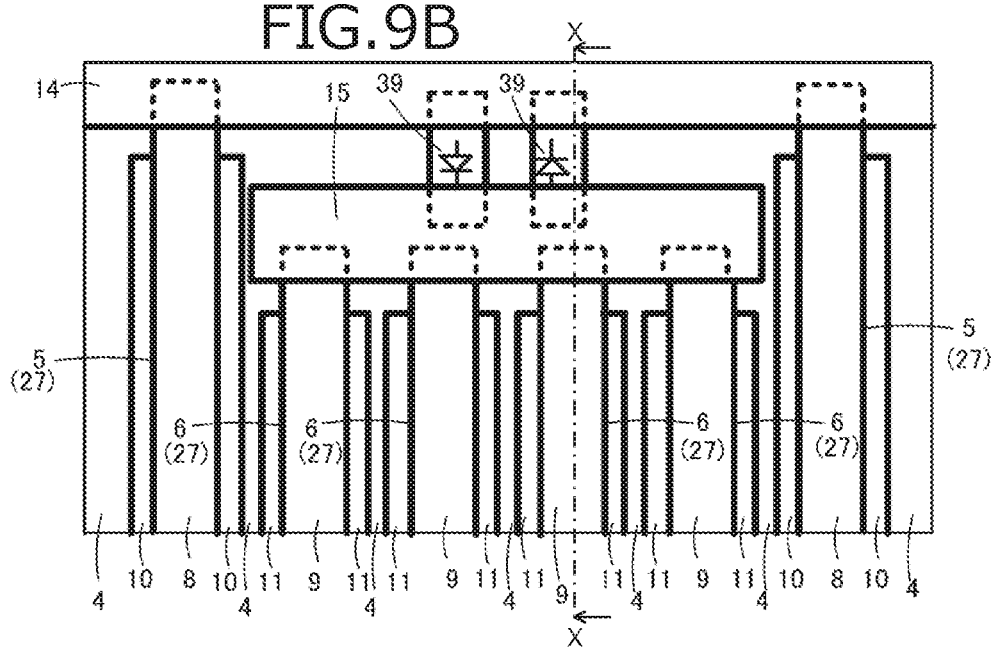
FIG. 9B is an enlarged diagram of a portion "a" in FIG. 9A.
Figure 12:
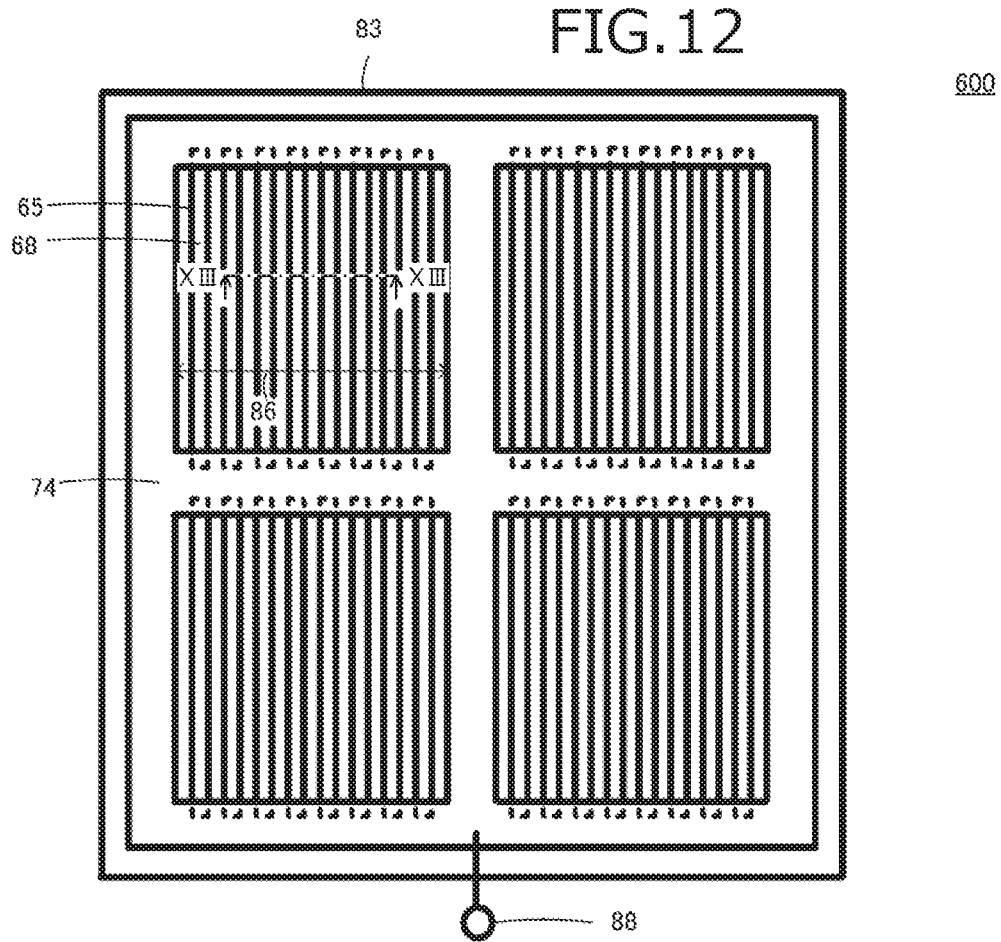
FIG. 12 is a plan diagram depicting an overall view of a semiconductor device 600 having a conventional trench structure.
Figure 13:
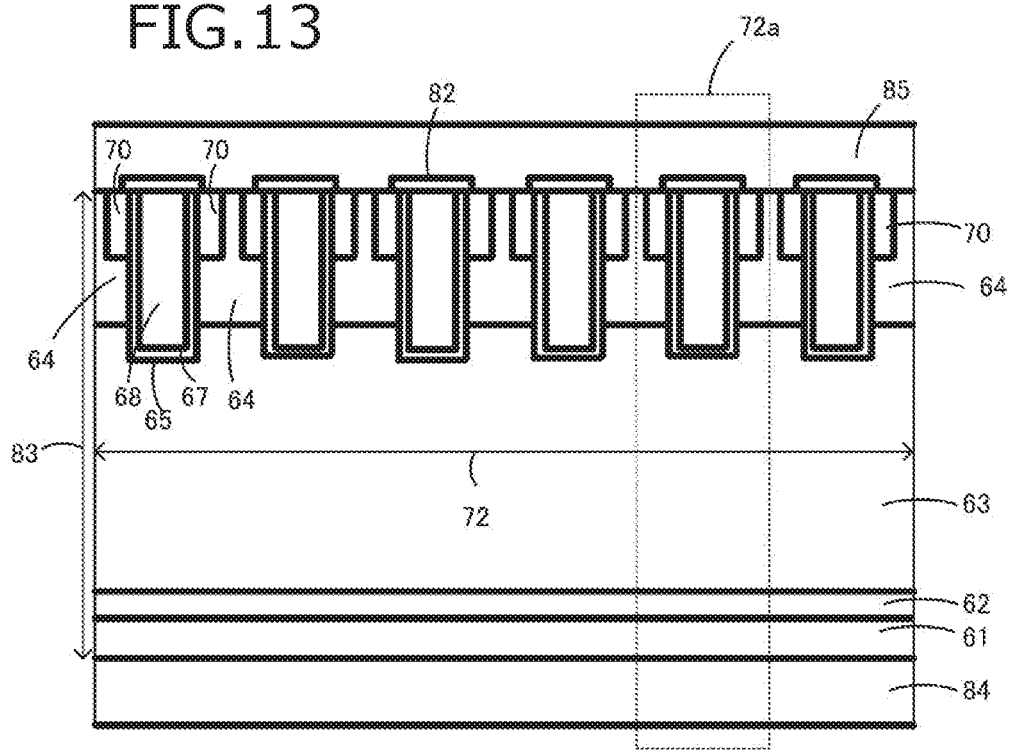
FIG. 13 is a cross-sectional view of the semiconductor device 600 along cutting line XIII-XIII in FIG. 12.
Figure 14:
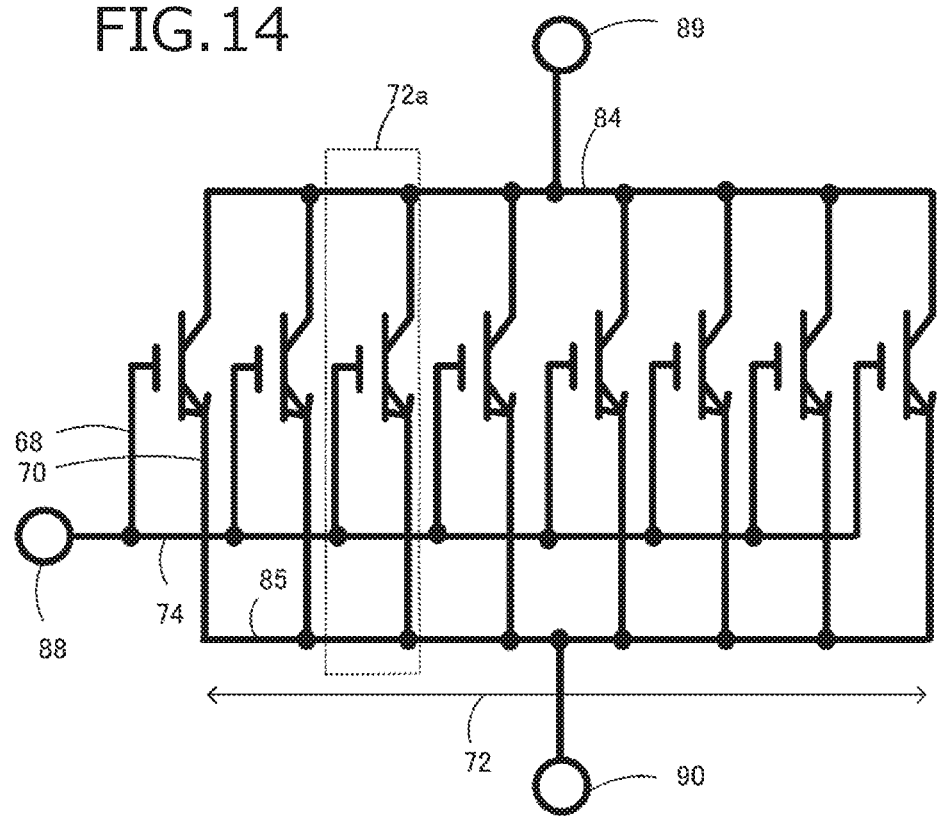
FIG. 14 is an equivalent internal circuit diagram of the semiconductor device 600.

FIGS. 9A, 9B, and 10 are configurational diagrams of a semiconductor device 500 of a fifth embodiment according to the present invention. FIG. 9A is a plan diagram depicting an overall view the semiconductor device 500. FIG. 9B is an enlarged diagram of a portion "a" in FIG. 9A. FIG. 10 is a cross-sectional view of the semiconductor device 500 along cutting line X-X in FIG. 9B. FIG. 11 is an equivalent circuit diagram of the semiconductor device 500 depicted in FIGS. 9A, 9B and 10.

The semiconductor device 500 differs from the semiconductor device 100 of FIGS. 1A to 3 in the first embodiment in that an inverse-parallel-connected diode 39 is connected instead of the capacitor 18. The inverse-parallel-connected diode 39 acts as the di/dt mitigating element. The gate input voltage Vin can be delivered being delayed to the second gate runner 15 by connecting the inverse-parallel-connected diode 39 between the first gate runner 14 and the second gate runner 15, and the turn-on starting time of the second IGBT cell group 13 can be delayed by about several ns to several 10 ns.

As a result, the di/dt of the IGBT (the semiconductor device 500) can be made to be gradual. The diode 39 is inverse-parallel-connected to set both the di/dt at the event of the turning on and the di/dt at the event of the turning off to be gradual. The diode 39 may be formed by, for example, diffusing a p-type impurity and an n-type impurity in a polysilicon.

The delay time can further be increased by connecting the diodes 39 in a plurality of stages in series. The delay time can be adjusted using the number of diodes 39 connected in series.

A specific amount of carriers generally needs to be accumulated in the pn junction for the diode 39 to establish an ON state, and the time period for the accumulation acts as the delay time. The delay time can, therefore, be controlled using the area of the pn junction of the diode 39. In the fifth embodiment, the rise time of the gate voltage Vg2 of the second IBGT cell group 13 is delayed by using the junction capacitance in the forward direction of the diode 39.

As described, according to the fifth embodiment, similarly to the semiconductor device 100 described in the first embodiment, the di/dt of the IGBT (the semiconductor device 500) can be made to be gradual by a simpler configuration.

According to the present invention, a semiconductor device can be provided that has a di/dt at turning on and turning off set to be gradual by a simpler method, that reduces the gate driving power, and that can suppress vibration of the current and the voltage at turning on and turning off.

Although the present invention has been described taking an example of an IGBT herein, examples are not limited hereto and the present invention is applicable to a diode and the like.

According to the present invention, the di/dt can be set to be gradual at turning on and turning off events, whereby vibrations of the current and the voltage can be suppressed at turning on and turning off events, and the gate driving power can be reduced.

As described, the semiconductor device according to the present invention is useful for power semiconductor devices used in power converting equipment such as a converter or an inverter.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
a semiconductor substrate;
an active region formed on the semiconductor substrate; and
a gate runner disposed to surround the active region, wherein
the active region includes
a first cell group in which a gate electrode of each cell is directly connected to the gate runner, and
a second cell group in which a gate electrode of each cell is connected to the gate runner via a current change mitigating element, the current change mitigating element including a capacitor that has
a trench disposed in the semiconductor substrate,
an insulating film covering an inner wall of the trench,
first and second electrodes disposed in the trench, the insulating film separating the first and second electrodes from the trench, and
a dielectric material disposed between the first and second electrodes.

2. The semiconductor device of claim 1, wherein each cell in the first cell group and the second cell group is an insulated gate bipolar transistor (IGBT) cell.

3. The semiconductor device of claim 1, wherein the current change mitigating element further includes a resistor that is connected in parallel to the capacitor.

4. The semiconductor device of claim 1, wherein the first and second electrodes are each formed using polysilicon.

5. The semiconductor device of claim 1, wherein the active region includes a metal oxide semiconductor (MOS) switching element.

6. A semiconductor device, comprising:
a semiconductor substrate;
an active region formed on the semiconductor substrate; and
a gate runner disposed to surround the active region, wherein
the active region includes
a first cell group having a plurality of first cells and a first gate wire, a gate electrode of each first cell being directly connected to the gate runner, and
a second cell group having a plurality of second cells and a second gate wire, a gate electrode of each second cell being connected to the gate runner via a current change mitigating element, the current change mitigating element includes a capacitor that uses the first gate wire of the first cell group and the second gate wire of the second cell group as electrodes thereof, a dielectric material being disposed between the first and second gate wires.

7. The semiconductor device of claim 6, wherein each first or second cell is an insulated gate bipolar transistor (IGBT) cell.

8. The semiconductor device of claim 6, wherein the current change mitigating element further includes a resistor that is connected in parallel to the capacitor.

9. The semiconductor device of claim 6, wherein the active region includes a metal oxide semiconductor (MOS) switching element.

10. A semiconductor device, comprising:
a semiconductor substrate;
an active region formed in the semiconductor substrate; and
a gate runner disposed to surround the active region, wherein the active region includes
a first cell group in which a gate electrode of each cell is directly connected to the gate runner, and a second cell group in which a gate electrode of each cell is connected to the gate runner via an inverse-parallel-connected diode.

11. The semiconductor device of claim 10, wherein each cell in the first cell group and the second cell group is an insulated gate bipolar transistor (IGBT) cell.

12. The semiconductor device according to claim 10, wherein the inverse-parallel-connected diode is formed using polysilicon.

13. The semiconductor device of claim 10, wherein the active region includes a metal oxide semiconductor (MOS) switching element.

14. The semiconductor device of claim 13, wherein the MOS switching element is an insulated gate bipolar transistor.

* * * * *